(12) United States Patent
Nakamura et al.

(10) Patent No.: US 8,850,907 B2
(45) Date of Patent: Oct. 7, 2014

(54) TEST CARRIER

(75) Inventors: Kiyoto Nakamura, Miyagi (JP); Yoshinari Kogure, Saitama (JP)

(73) Assignee: Advantest Corporation, Tokyo (JP)

(*) Notice: Subject to any disclaimer, the term of this patent is extended or adjusted under 35 U.S.C. 154(b) by 708 days.

(21) Appl. No.: 13/103,142

(22) Filed: May 9, 2011

(65) Prior Publication Data

US 2011/0271774 A1 Nov. 10, 2011

(30) Foreign Application Priority Data

May 10, 2010 (JP) ................... 2010-108521

(51) Int. Cl.
*G01D 21/00* (2006.01)
*G01R 1/04* (2006.01)
*G01R 31/00* (2006.01)
*G01R 31/20* (2006.01)

(52) U.S. Cl.
CPC .................... *G01R 1/0408* (2013.01)
USPC ............. 73/866.5; 324/756.02; 324/756.01; 324/757.04; 324/757.01

(58) Field of Classification Search
CPC ..... H01L 21/68; H01L 21/302; H01L 21/673; H01L 21/67; H01L 31/18; H01L 31/186; H01L 31/1892; H01L 2225/06596; H01L 21/66; H01L 22/34; H01L 21/603; H01L 24/80; H05K 3/0085; G01R 1/0408
USPC ............ 73/866.5, 865.9; 324/537, 757.01, 324/756.01, 756.02, 754.08, 754.09, 324/755.01, 756.07, 757.02, 757.03, 757.04
See application file for complete search history.

(56) References Cited

U.S. PATENT DOCUMENTS

| | | | |
|---|---|---|---|
| 5,757,199 A * | 5/1998 | Maruyama | ............... 324/750.03 |
| 5,828,224 A | 10/1998 | Maruyama | |
| 5,986,459 A | 11/1999 | Fukaya et al. | |
| 2002/0111051 A1 | 8/2002 | Hashimoto | |
| 2006/0029762 A1* | 2/2006 | Chung | ................. 428/40.1 |
| 2008/0044940 A1 | 2/2008 | Watanabe et al. | |
| 2011/0089968 A1 | 4/2011 | Kogure et al. | |
| 2011/0148020 A1 | 6/2011 | Kogure | |

FOREIGN PATENT DOCUMENTS

| | | |
|---|---|---|
| JP | 07-263504 | 10/1995 |
| JP | 7-263504 | 10/1995 |
| JP | 10-068758 | 3/1998 |
| JP | 2002-50751 | 2/2002 |
| JP | 2002-243795 | 8/2002 |

OTHER PUBLICATIONS

U.S. Appl. No. 13/018,726 to Yasuhide Takeda et al., filed Feb. 1, 2011.

* cited by examiner

*Primary Examiner* — Daniel S Larkin
*Assistant Examiner* — Jamar Ray
(74) *Attorney, Agent, or Firm* — Greenblum & Bernstein, P.L.C.

(57) ABSTRACT

[Problem] A test carrier able to secure a high air-tightness is provided.
[Solution] A test carrier 10 comprises a cover member 50A and a base member 20A which are bonded together while sandwiching a die 90 between them. ultraviolet rays can pass through the cover member 50A.

6 Claims, 21 Drawing Sheets

TEST CARRIER

TECHNICAL FIELD

The present invention relates to a test carrier on which a die chip is temporarily mounted for testing an integrated circuit device or other electronic circuit device which is formed in the die chip. It is to be noted that the contents described and/or illustrated in the documents relevant to Japanese Patent Application No. 2010-108521 filed on May 10, 2010 will be incorporated herein by reference, as a part of the description and/or drawings of the present application.

BACKGROUND ART

As a test carrier on which a semiconductor chip in a bare chip state is temporarily mounted, there is known one which sandwiches the semiconductor chip between a lid member and a base member in an atmosphere which is reduced in pressure compared with the outside air (for example, see PLT 1).

CITATION LIST

Patent Literature

PLT 1: Japanese Patent Publication (A) No. H07-263504

SUMMARY OF INVENTION

Technical Problem

In the above test carrier, the atmospheric pressure of the outside environment is utilized to bring the electrodes of the semiconductor chip and the electrodes of the lid member into contact, so a high air-tightness is required in the holding space which is formed between the lid member and the base member.

The problem to be solved by the present invention is to provide a test carrier which can secure a high air-tightness.

Solution to Problem

[1] The test carrier according to the present invention is a test carrier comprising a first member and a second member which are bonded to each other with an electronic device therebetween, wherein ultraviolet rays can pass through the first member.

[2] In the above invention, the second member may be opaque to ultraviolet rays.

[3] Further, the test carrier according to the present invention is a test carrier comprising a first member and a second member which are bonded to each other with an electronic device therebetween, wherein the first member has: a first film through which ultraviolet rays can pass; and a first frame which has a first opening formed at a center of the first frame, the first frame through which ultraviolet rays can pass, and the first frame to which the first film adheres.

[4] In the above invention, the second member may have: a second film; and a second frame which has a second opening formed at a center of the second frame and to which the second film adheres, and the electronic device may be interposed between the first film and the second film.

[5] In the above invention, the second film may be opaque to ultraviolet rays.

[6] In the above invention, one of the first opening or the second opening may be smaller than the other of the second opening or the first opening.

[7] In the above invention, the second member may have a second film and the electronic device may be interposed between the first film and the second film.

[8] In the above invention, the second film may be opaque to ultraviolet rays.

[9] In the above invention, the second member may have a plate-shaped rigid board and the electronic device may be interposed between the first film and the rigid board.

[10] In the above invention, the rigid board may be opaque to ultraviolet rays.

[11] Further, the test carrier according to the present invention is a test carrier comprising a first member and a second member which are bonded to each other with an electronic device therebetween, wherein the first member has a first film through which ultraviolet rays can pass.

[12] In the above invention, the second member may have a second film and the electronic device may be interposed between the first film and the second film.

[13] In the above invention, the second film may be opaque to ultraviolet rays.

[14] In the above invention, the second member may have a plate-shaped rigid board, and the electronic device may be interposed between the first film and the rigid board.

[15] In the above invention, the rigid board may be opaque to ultraviolet rays.

[16] In the above invention, the electronic device may be a die which formed by dicing the semiconductor wafer.

[17] In the above invention, the first member and the second member may be bonded by a ultraviolet cure adhesive.

[18] In the above invention, a holding space which is formed between the first member and the second member and which holds the electronic device may be reduced in pressure compared with the outside air.

[19] In the above invention, one of the second member or the first member may be larger than the other of the first member or the second member, while one of the second member or the first member may have an exposed part at a bonding surface with the other of the first member or the second member.

Advantageous Effects of Invention

In the present invention, UV rays can pass through the first member, so it is possible to accurately cure the adhesive which bonds the first member and the second member and possible to secure a high air-tightness.

DESCRIPTION OF EMBODIMENTS

Below, embodiments of the present invention will be explained on the basis of the drawings.

First Embodiment

Figure 1:
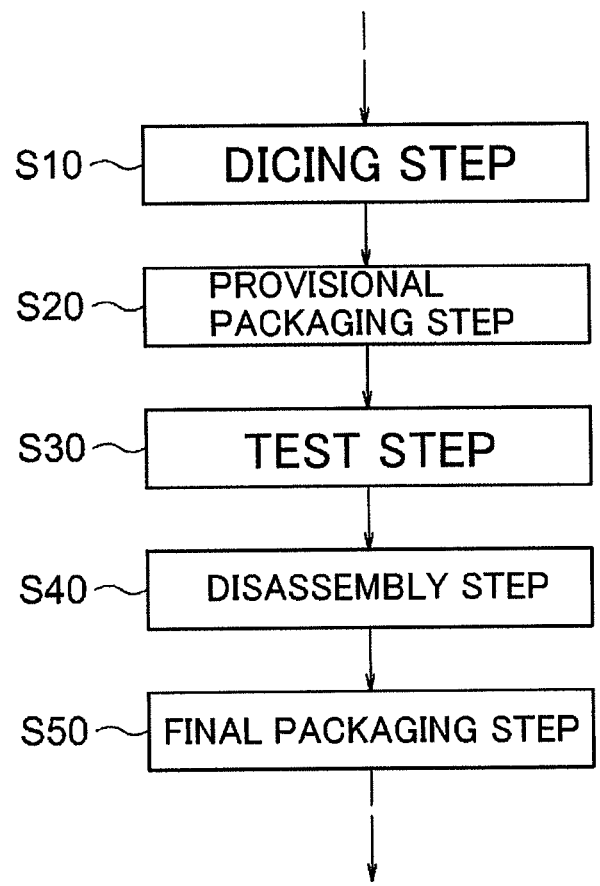
FIG. 1 is a flowchart showing part of a process of production of a device in a first embodiment of the present invention.

FIG. 1 is a flowchart showing part of a process of production of a device in a first embodiment of the present invention.

In the present embodiment, after a semiconductor wafer is diced (after step S10 of FIG. 1) and before final packaging (before step S50), an integrated circuit device or other electronic circuit device which is formed into the die 90 is tested (steps S20 to S40).

In the present embodiment, first, the die 90 is temporarily mounted on a test carrier 10 (step S20). Next, the die 90 is electrically connected to a test system (not shown) through this test carrier 10 to thereby run a test on the electronic circuit device formed in the die 90 (step S30). Further, after this test is finished, the test carrier 10 is disassembled to take out the die 90 from the carrier 10 (step S40), then this die 90 is finally packaged whereby the device is completed as a final product.

Below, a test carrier 10 on which a die 90 is temporarily mounted (provisionally packaged) in the present embodiment will be explained.

Figure 5:
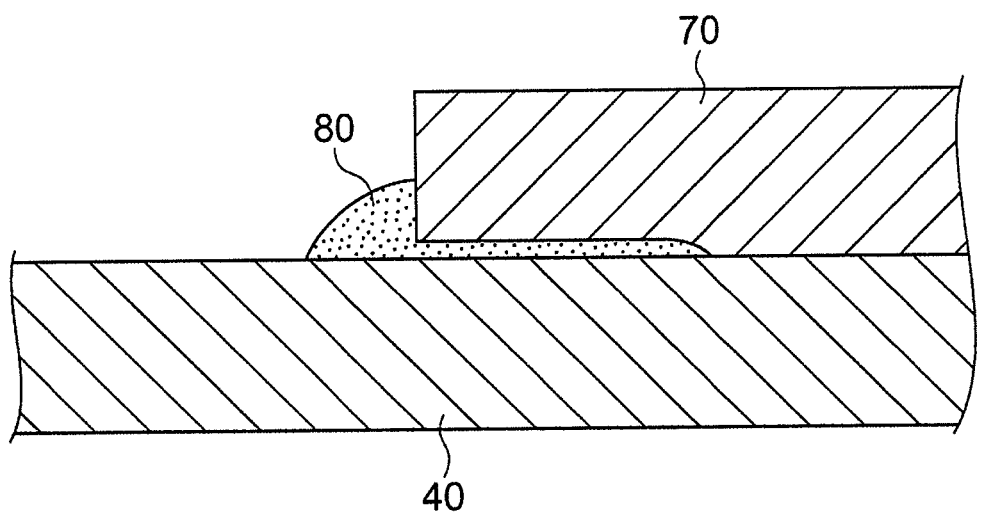
FIG. 5 is an enlarged view of part V in FIG. 3.
Figure 6:
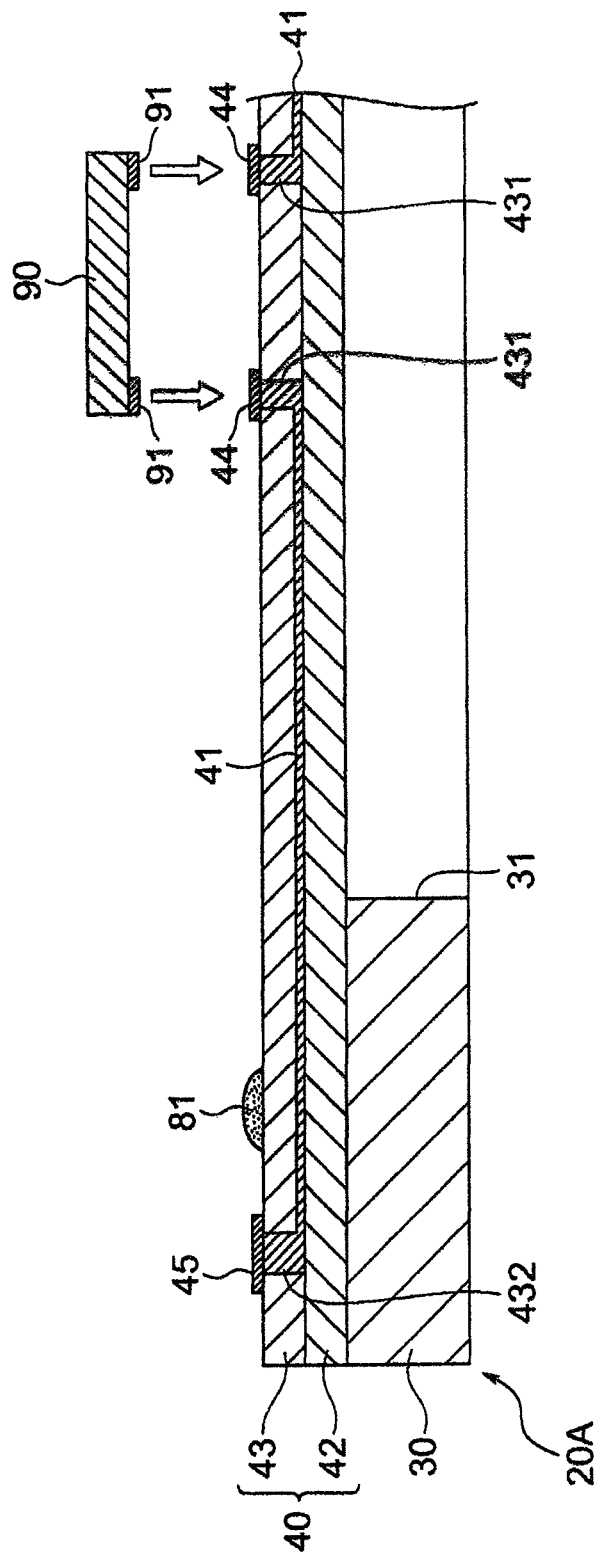
FIG. 6 is an enlarged view of part VI in FIG. 4.
Figure 7:
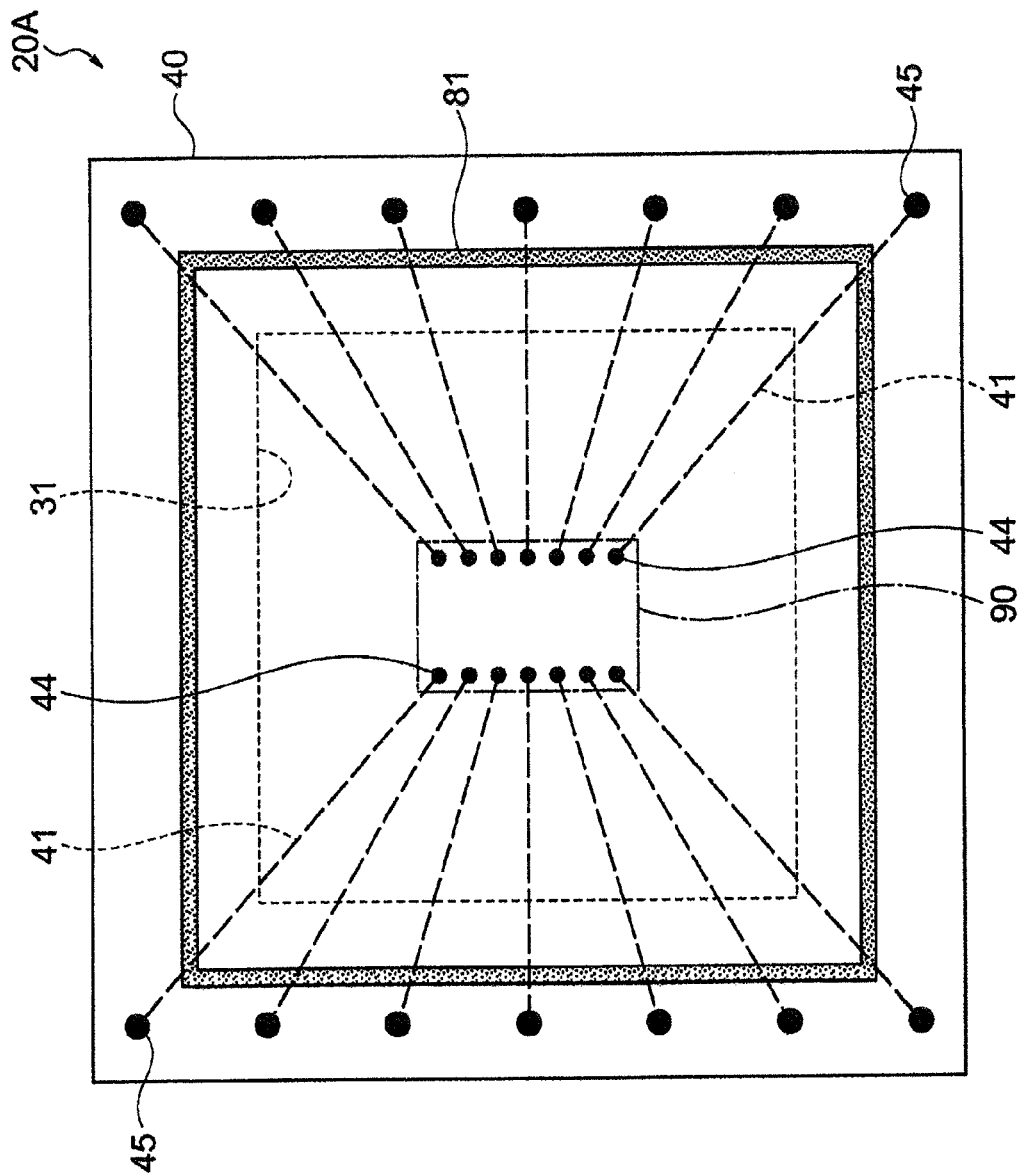
FIG. 7 is a plan view of a base member of the test carrier in the first embodiment of the present invention.
Figure 8:
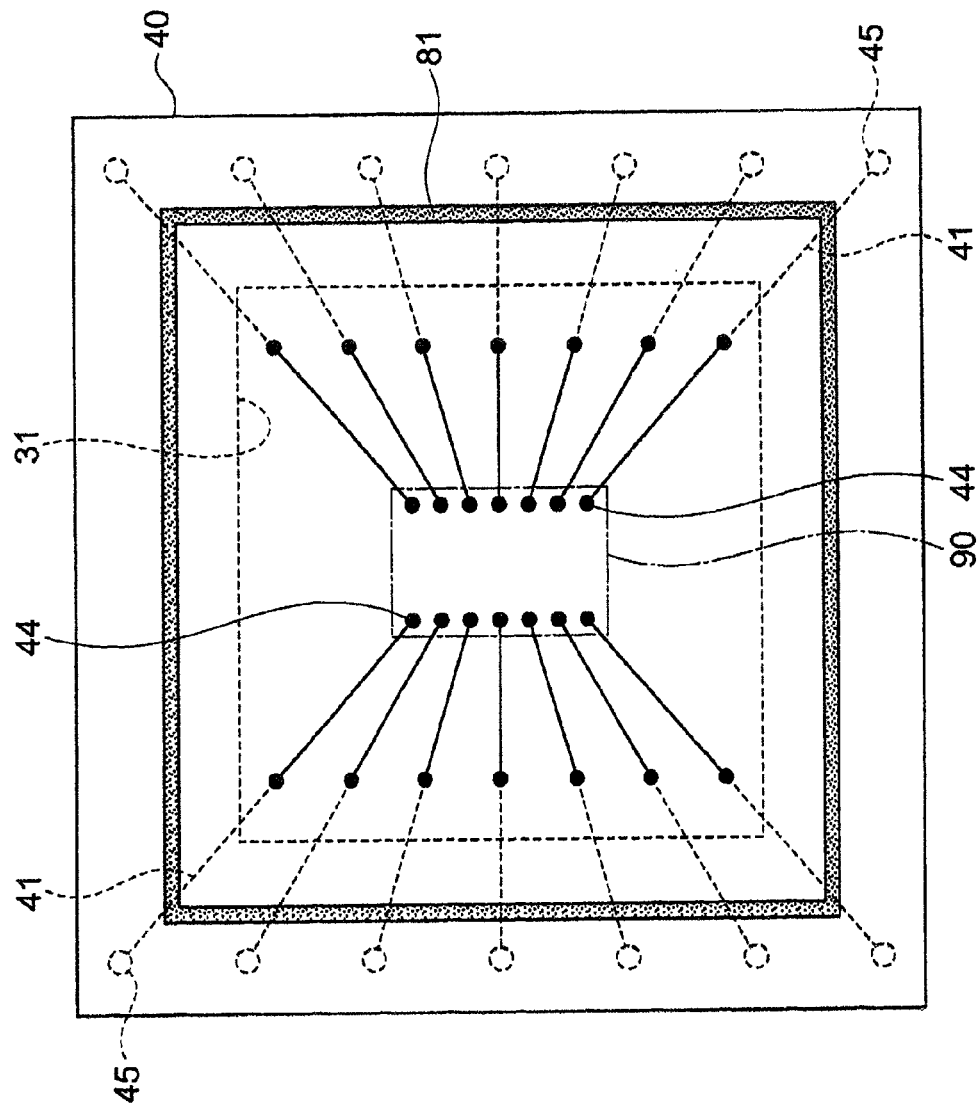
FIG. 8 is a plan view of a modification of interconnect patterns in the first embodiment of the present invention.

FIG. 2 to FIG. 6 are views showing a test carrier in the present embodiment, FIG. 7 is a view showing a base member of that test carrier, FIG. 8 is a view showing a modification of the interconnect patterns, and FIG. 9 to FIG. 14 are cross-sectional views showing modifications of the test carrier in the present embodiment.

Figure 2:
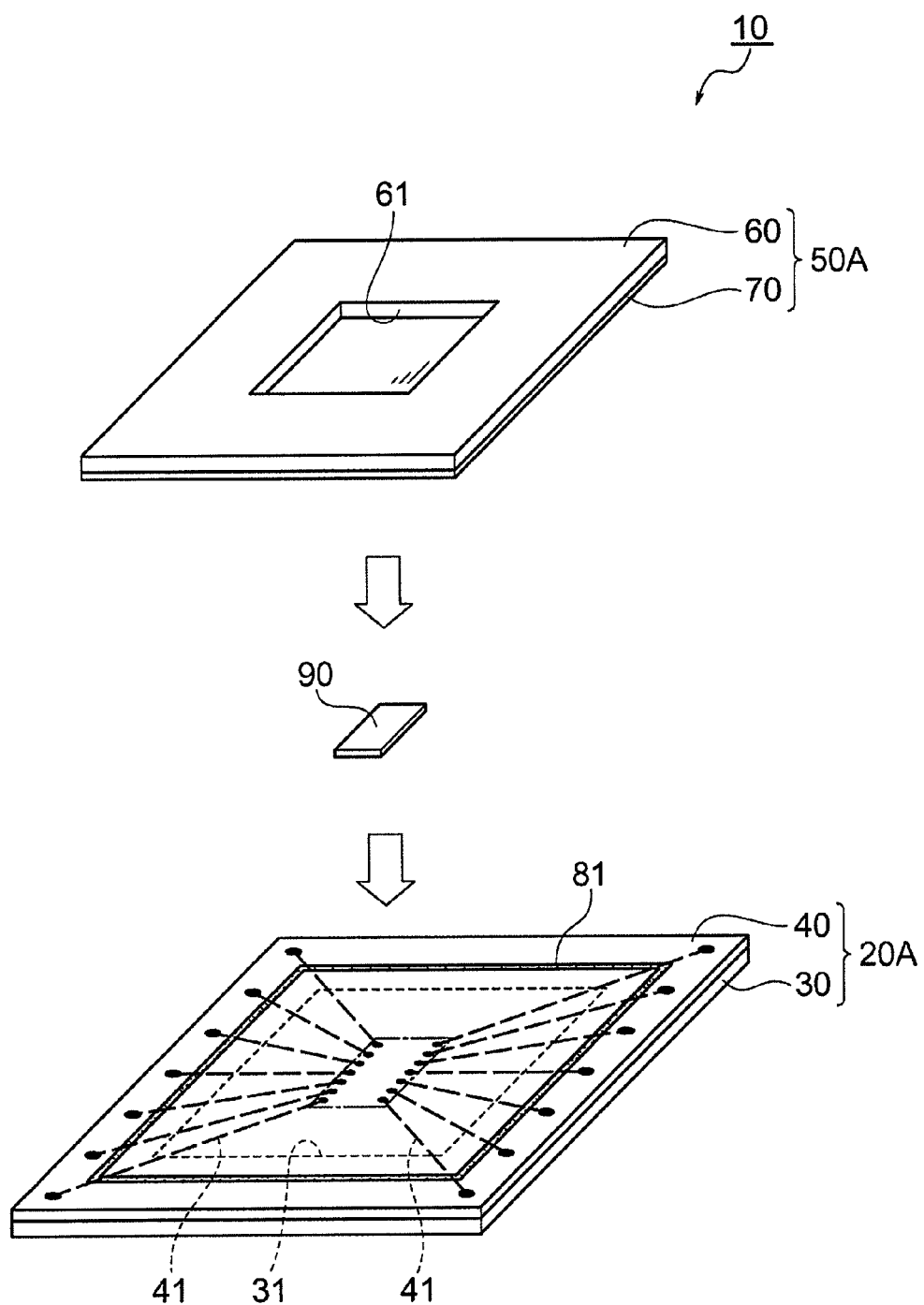
FIG. 2 is a disassembled perspective view of a test carrier in the first embodiment of the present invention.
Figure 3:
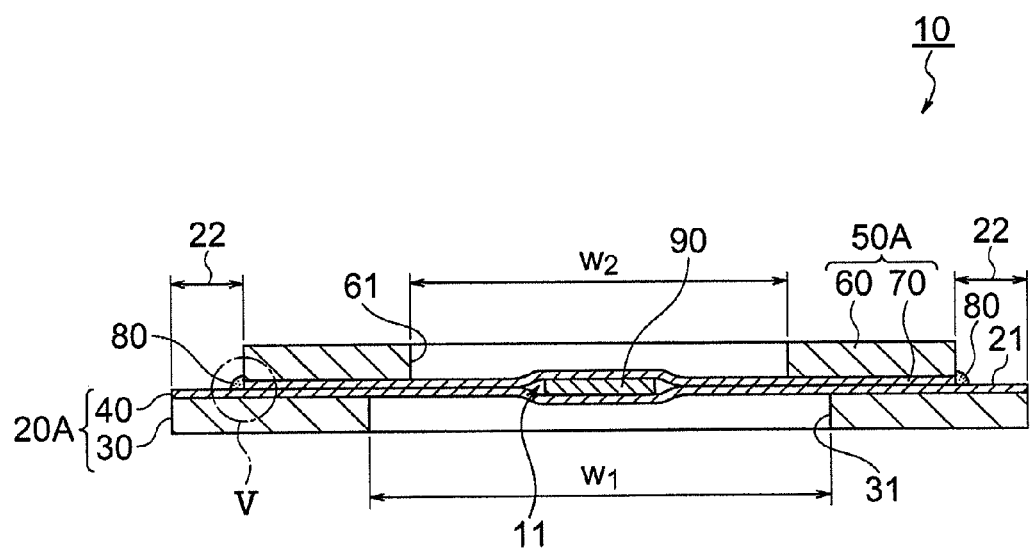
FIG. 3 is a cross-sectional view of the test carrier in the first embodiment of the present invention.
Figure 4:
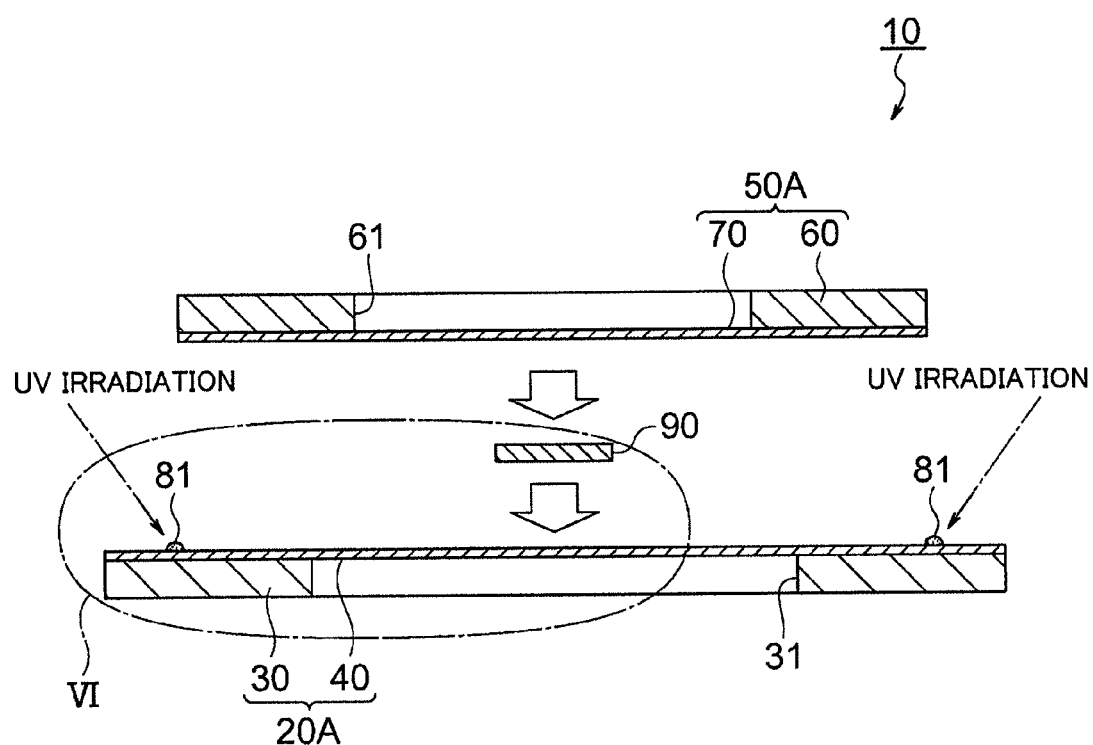
FIG. 4 is a disassembled perspective view of the test carrier in the first embodiment of the present invention.

The test carrier 10 in the present embodiment, as shown in FIG. 2 to FIG. 4, comprises a base member 30A on which a die 90 is to be placed and a cover member 50A which is covered over this base member 20A. This test carrier 10 holds the die 90 by sandwiching the die 90 between the base member 20A and the cover member 50A in a state reduced in pressure from atmospheric pressure.

The base member 20A comprises a base frame 30 and a base film 40.

The base frame 30 is a rigid board which has a high rigidity (at least a rigidity higher than the base film 40 and the cover film 70) and which is formed with an opening 31 at its center. This base frame 30 is, for example, composed of a polyamide imide resin, ceramics, glass, etc. and is designed to be opaque to ultraviolet rays (ultraviolet rays cannot pass through the base frame 30).

The base film 40 is a film which has pliability and is adhered to the entire surface of the base frame 30, including the center opening 31, by an adhesive (not shown). In this way, in the present embodiment, the base film 40 which has pliability adheres to the highly rigid base frame 30, so the handling ability of the base member 20A is improved.

As shown in FIG. 6, this base film 40 has a base layer 42 on which the interconnect patterns 41 are formed and a cover layer 43 which covers this base layer 42. Both of the base layer 42 and cover layer 43 of the base film 40 are for example formed from a reddish brown or other colored polyimide film and are designed to be opaque to ultraviolet rays (ultraviolet rays cannot pass through the base layer 42 and cover layer 43 of the base film 40). The interconnect patterns 41, for example, are formed by etching copper foil which is laminated over the base layer 42.

As shown in FIG. 6 and FIG. 7, first ends of the conductor patterns 41 are connected to the pads 44 via through holes 431 of the cover layer 43. Electrodes 91 of the die 90 are connected to these pads 44. On the other hand, the other ends of the conductor patterns 41 are connected to the external terminals 45 via through holes 432 of the cover layer 43. At the time of a test of the electronic circuit device of the die 90, contact pins of the test system contact to the external terminals 45.

Note that, the interconnect patterns 41 are not particularly limited to the above configuration. For example, as shown in FIG. 8, part of the interconnect patterns 41 may also be formed on the surface of the base film 40 in real time by ink jet printing. Alternatively, all of the interconnect patterns 41 may be formed by ink jet printing.

Further, the positions of the pads 44 and the positions of the external terminals 45 are not particularly limited. They may also be configured as shown in FIG. 9 to FIG. 13 explained below or may be configured by a combination of the same.

Figure 9:
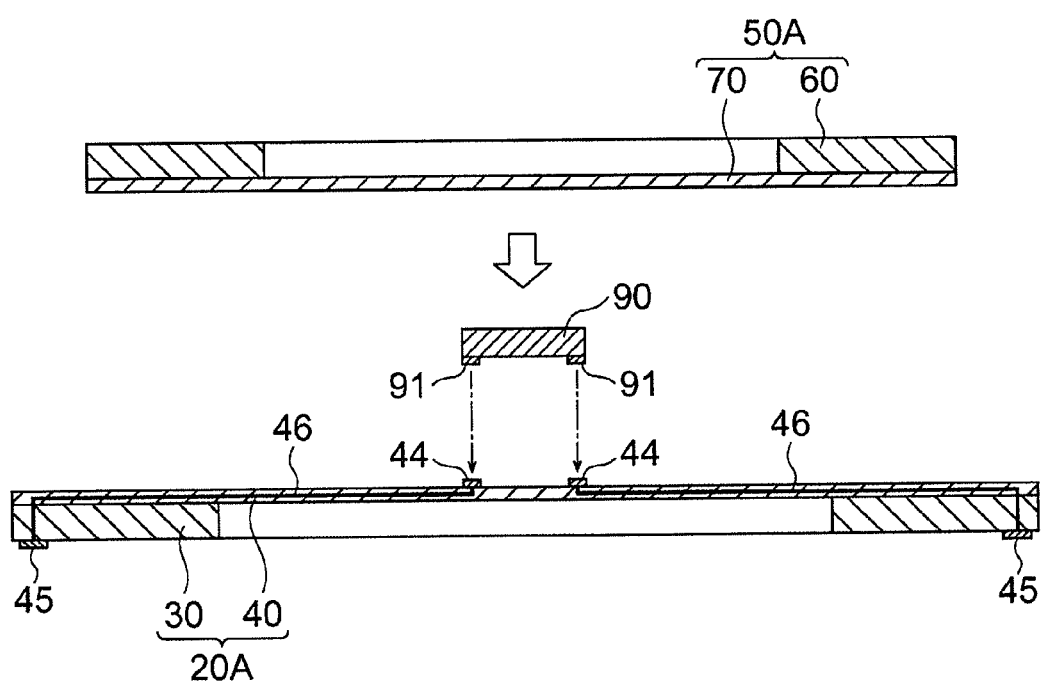
FIG. 9 is a cross-sectional view of a first modification of the test carrier in the first embodiment of the present invention.

For example, as shown in the first modification shown in FIG. 9, it is also possible to form the pads 44 on the top surface of the base film 40 and to form the external terminals 45 on the bottom surface of the base frame 30. In this case, the conduction paths 46 which connect the pads 44 and the external terminals 45 are formed in the base film 40 and base frame 30.

Figure 10:
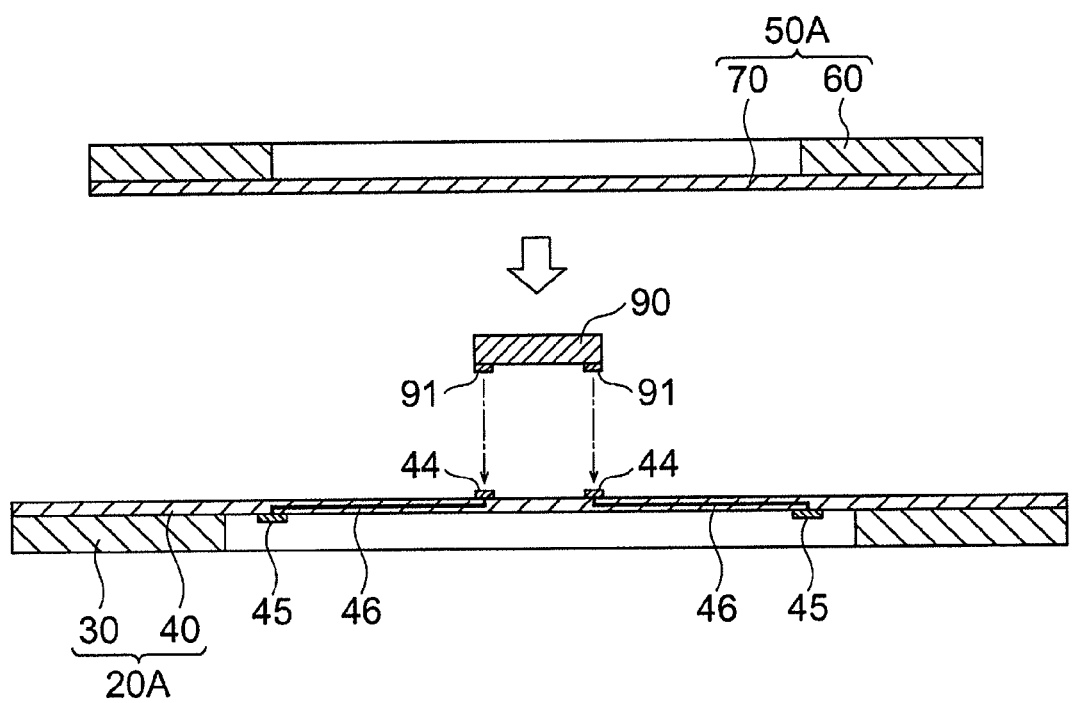
FIG. 10 is a cross-sectional view of a second modification of the test carrier in the first embodiment of the present invention.

Further, as shown in the second modification shown in FIG. 10, it is also possible to form the pads 44 on the top surface of the base film 40 and to form the external terminals 45 on the bottom surface of the base film 40. In this case, the conduction paths 46 are formed in the base film 40.

Figure 11:
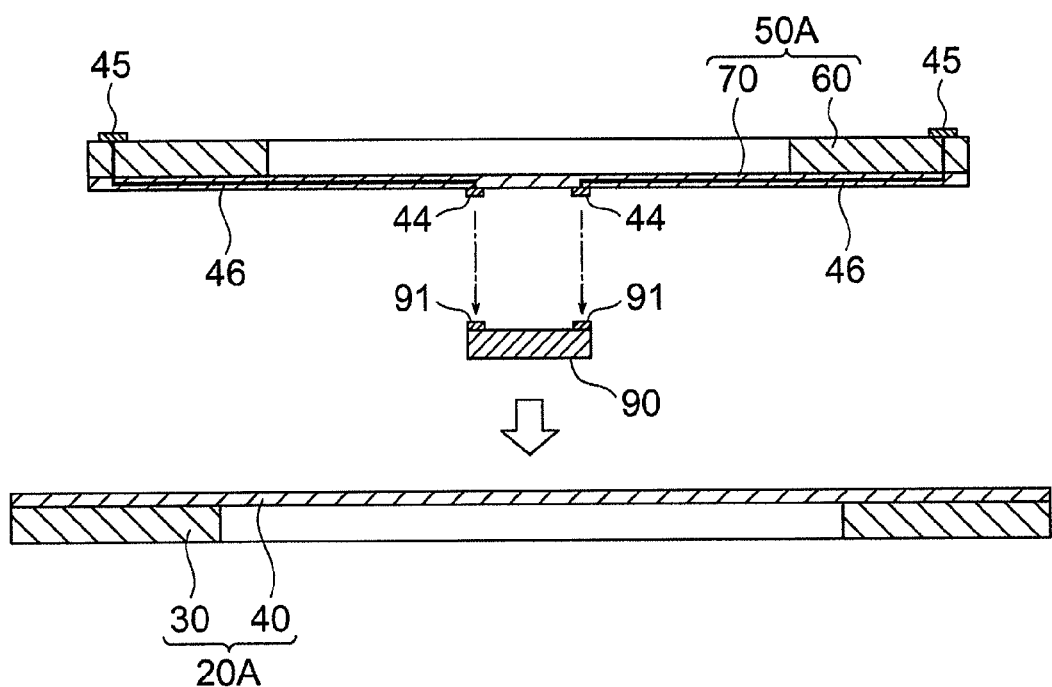
FIG. 11 is a cross-sectional view of a third modification of the test carrier in the first embodiment of the present invention.

Further, as shown in the third modification shown in FIG. 11, it is also possible to form the pads 44 on the bottom surface of the cover film 70 and to form the external terminals 45 on the top surface of the cover frame 60. In this case, the conduction paths 46 are formed in the cover film 70 and the cover frame 60. Note that, while not particularly shown, it is also possible to use a similar procedure as in the example shown in FIG. 10 so as to form the external terminals 45 on the top surface of the cover film 70.

Figure 12:
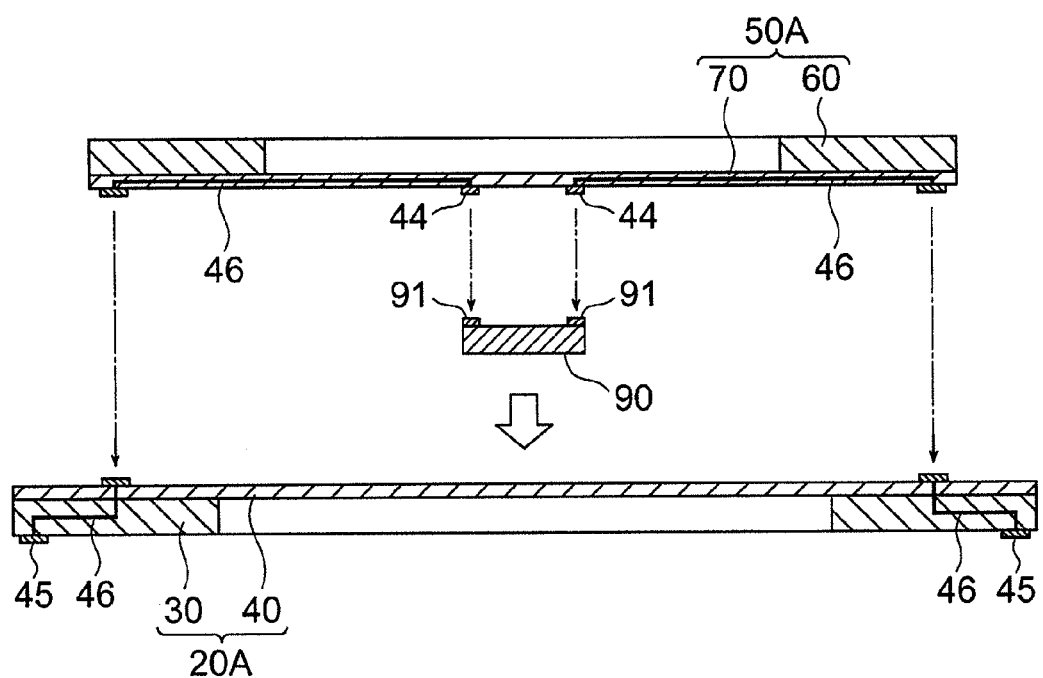
FIG. 12 is a cross-sectional view of a fourth modification of the test carrier in the first embodiment of the present invention.

Further, as shown in the fourth modification shown in FIG. 12, it is also possible to form the pads 44 on the bottom surface of the cover film 70 and form the external terminals 45 on the bottom surface of the base frame 30. In this case, the conductive parts 46 are formed in the cover film 70, base film 40, and base frame 30.

Figure 13:
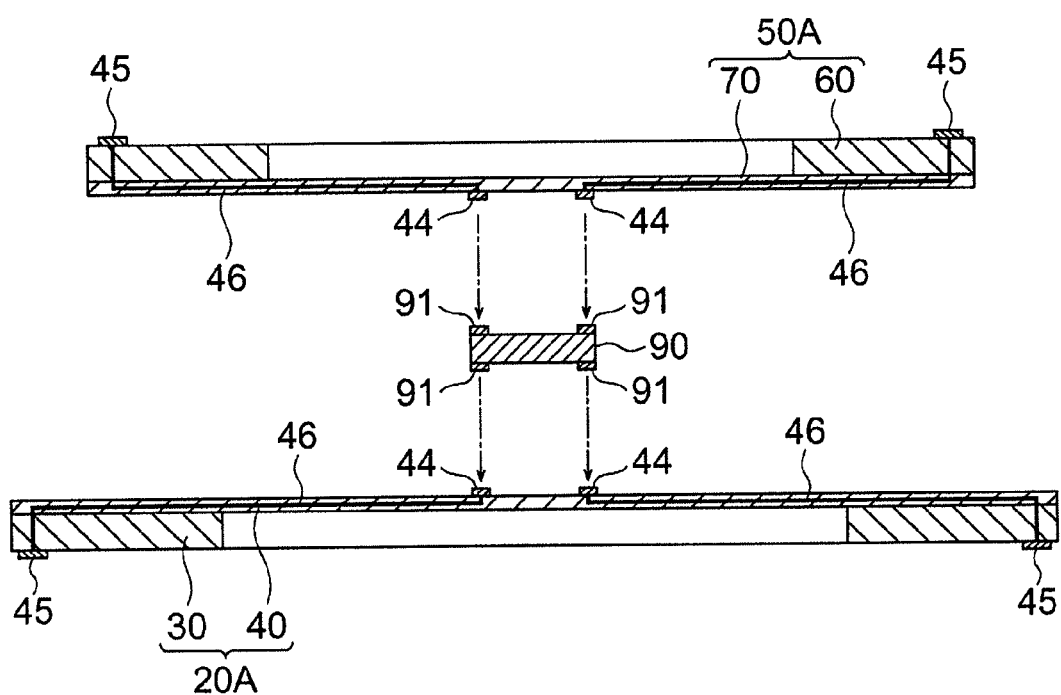
FIG. 13 is a cross-sectional view of a fifth modification of the test carrier in the first embodiment of the present invention.

Furthermore, when the die 90 has electrodes 91 on both its top surface and bottom surface, it is also possible, like in the fifth modification shown in FIG. 13, to form the pads 44 on both of the base film 40 and cover film 70 and to form the external terminals 45 on both the base frame 30 and cover frame 60.

Returning to FIG. 2 to FIG. 4, the cover member 50A comprises a cover frame 60 and a cover film 70.

The cover frame 60 is a rigid board which has a high rigidity (at least a higher rigidity than the base film 40 or cover film 70) and has an opening 61 formed at its center. In the present embodiment, this cover frame 60 is, for example, composed of quartz glass etc. and is designed to be able to transmit ultraviolet rays (ultraviolet rays can pass through the cover frame 60).

Note that, in the present embodiment, as shown in FIG. 3, an inside diameter $w_2$ of the center opening 61 of the cover frame 60 is smaller than an inside diameter $w_1$ of the center opening 31 of the base frame 30. For this reason, at the time of disassembly of the test carrier 10A, it is possible to press against the cover frame 60 through the center opening 31 of the base frame 30 from the bottom while holding the base frame 30 and thereby easily disassemble the test carrier 10A. Note that, the relationship of size of the center openings 31 and 61 may also be opposite.

Further, in the present embodiment, as shown in the same figure, the base member 20A is larger than the cover member 50A, so the region 22 (exposed part) outside from the cover member 50A in the top surface 21 of the base member 20A (bonding surface of base member 20A with cover member 50A) is exposed. For this reason, it is also possible to press against this exposed part 22 while holding the cover member 50A so as to disassemble the test carrier 10. Note that, it is also possible to be the cover member 50A larger than the base member 20A so as to provide an exposed part at the cover member 50A.

The cover film 70 is a film which has pliability and is adhered to the entire surface of the cover frame 60, including the center opening 61, by an adhesive (not shown). In the present embodiment, the cover film 70 which has pliability adheres to the highly rigid cover frame 60, so the handling ability of the cover member 50A is improved. In the present embodiment, this cover film 70 is, for example, formed from a colorless transparent polyimide film or colorless transparent aramid film etc. and is designed to be able to transmit ultraviolet rays (ultraviolet rays can pass through the cover film 70).

The test carrier 10 explained above is assembled as follows:

That is, first, the electrodes 91 are aligned with the pads 44 and, in that state, the die 90 is placed on the base film 40 of the base member 20A.

Next, in an environment reduced in pressure compared with atmospheric pressure, the cover member 50A is placed on the base member 20A and the die 90 is sandwiched between the base member 20A and the cover member 50A. At this time, the cover member 50A is placed over the base member 50A so that the base film 40 of the base member 20A and the cover film 70 of the cover member 50A directly contact each other.

Next, in the state with the die 90 sandwiched between the base member 20A and the cover member 50A, the test carrier 10 is returned to an atmospheric pressure environment whereby the die 90 is held inside the holding space 11 which is formed between the base member 20A and the cover member 50A (see FIG. 3).

Note that, the electrodes 91 of the die 90 and the pads 44 of the base film 40 may be fastened by solder etc. In the present embodiment, the holding space 11 is reduced in pressure compared with the outside air, so the base film 40 and the cover film 70 press against the die 90 whereby the electrodes 91 of the die 90 and the pads 44 of the base film 40 contact each other.

As shown in FIG. 3 and FIG. 5, to maintain the air-tightness of the holding space 11, the base member 20A and the cover member 50A are fastened together by the bonded part 80. As the adhesive 81 which forms this bonded part 80, for example, an ultraviolet cure adhesive can be illustrated.

This adhesive 81, as shown in FIG. 2, FIG. 4, FIG. 6, and FIG. 7, is applied to a portion of the base member 20A facing the outer circumference of the cover member 50A. Further, as shown in FIG. 4, the base member 20A is covered by the cover member 50A, then ultraviolet rays are irradiated from the cover member 50A side toward the adhesive 81 to cure the adhesive 81 whereby a bonded part 80 is formed.

The thus formed bonded part 80, as shown in FIG. 5, is interposed between the base film 40 and the cover film 70 at the outer circumference of the cover member 50A and sticks out above the base film 40 and adheres to the outer circumference end face of the cover member 50A.

In the present embodiment, both the cover frame 60 and cover film 70 of the cover member 50A are designed to be able to transmit ultraviolet rays, so it is possible to accurately irradiate ultraviolet rays to the ultraviolet cure adhesive.

Further, in the present embodiment, by applying an ultraviolet cure adhesive as the adhesive 81 which forms the bonded part 80, it is possible to shorten the curing time and to cure the adhesive more evenly so as to secure a sufficient air-tightness in comparison with a thermosetting adhesive etc.

Further, in the present embodiment, the base film 40 of the base member 20A is designed to be opaque to ultraviolet rays, so it is possible to utilize reflection of the ultraviolet rays on the base film 40 to further promote curing of the ultraviolet cure adhesive.

Note that, it is also possible for the base frame 30 and base film 40 of the base member 20A to be able to transmit ultraviolet rays and for the cover film 70 of the cover member 50A to be opaque to ultraviolet rays and to irradiate ultraviolet rays from the base member 20A side toward the adhesive 81.

Figure 14:
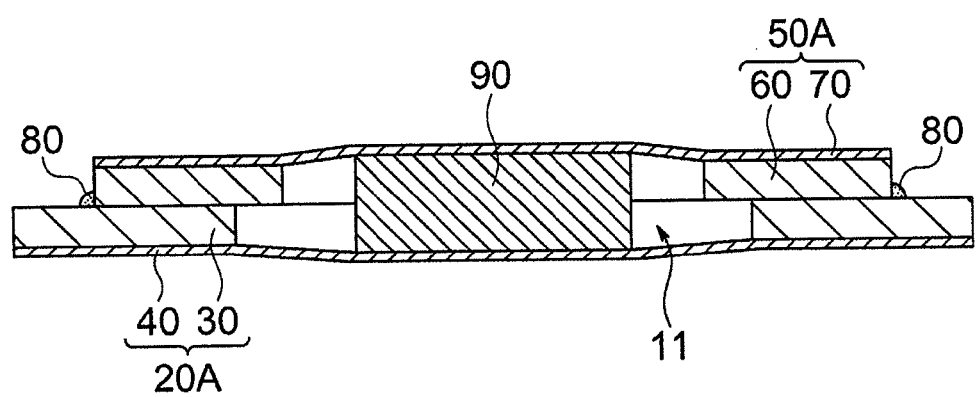
FIG. 14 is a cross-sectional view of a sixth modification of the test carrier in the first embodiment of the present invention.

Further, when the die 90 is relatively thick, like in the sixth modification shown in FIG. 14, the cover member 50A may be laid over the base member 20A so that the base frame 30 and the cover frame 60 directly contact each other.

Second Embodiment

Figure 15:
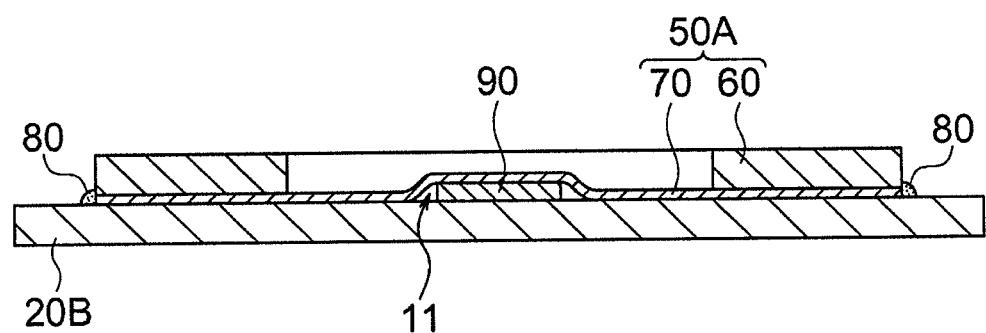
FIG. 15 is a cross-sectional view of a test carrier in a second embodiment of the present invention.

FIG. 15 is a view showing a test carrier in a second embodiment of the present invention.

In the present embodiment, the base member differs in configuration from the first embodiment (see FIG. 3), but the rest of the configuration is similar to the first embodiment. Below, only the points of difference of the test carrier in the second embodiment from the first embodiment will be explained. Parts configured similar to the first embodiment are assigned the same reference notations and explanations thereof are omitted.

As shown in FIG. 15, the base member 20B in the present embodiment comprises only a plate-shaped rigid board which has a high rigidity (at least a higher rigidity than the cover film 70), but does not have a center opening. This base member 20B is, for example, composed of polyamide imide resin or ceramics, glass, etc. and is designed to be opaque to ultraviolet rays (ultraviolet rays cannot pass through the base member 20B). Note that, while not particularly shown, by forming the base member 20B by for example a single layer or multi layer printed circuit board, it is possible to form interconnect patterns 41 at the base member 20B.

In the present embodiment, both of the cover frame 60 and cover film 70 of the cover member 50A is designed to transmit ultraviolet rays (ultraviolet rays can pass through the cover frame 60 and cover file 70), so it is possible to accurately irradiate ultraviolet rays to the ultraviolet cure adhesive.

Further, in the present embodiment, by applying an ultraviolet cure adhesive as the adhesive forming the bonded part 80, it is possible to shorten the curing time and to cure the adhesive more evenly so as to secure a sufficient air-tightness in comparison with a thermosetting adhesive etc.

Further, in the present embodiment, the base member 20B is designed to be opaque to ultraviolet rays, so it is possible to utilize reflection of the ultraviolet rays on the base film 40 to further promote curing of the ultraviolet cure adhesive.

Note that it is also possible for the base member 20B to be able to transmit ultraviolet rays and for the cover film 70 of the cover member 50A to be opaque to ultraviolet rays.

Further, in the example shown in FIG. 15, the cover member 50A is laid over the base member 20B so that the cover film 70 and base member 20B directly contact each other, but the invention is not particularly limited to this. For example, when the die 90 is relatively thick, while not particularly shown, the cover member 50A may be laid over the base member 20B so that the cover frame 60 and the base member 20B directly contact each other.

Third Embodiment

Figure 16:
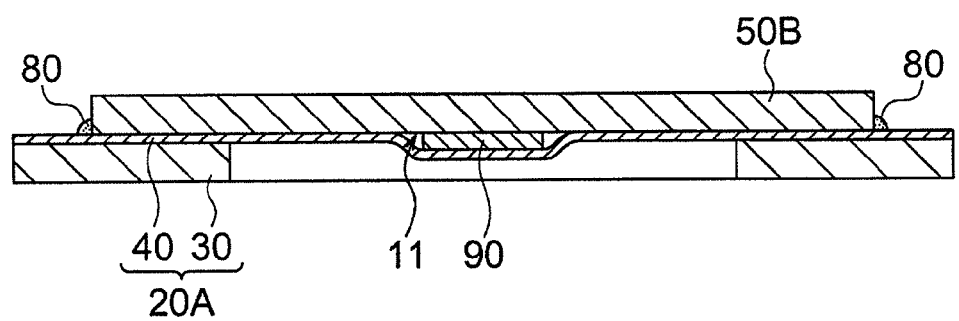
FIG. 16 is a cross-sectional view of a test carrier in a third embodiment of the present invention.

FIG. 16 is a view showing a test carrier in a third embodiment of the present invention.

In the present embodiment, the cover member differs in configuration from the first embodiment (see FIG. 3), but the rest of the configuration is similar to the first embodiment. Below, only the points of difference of the test carrier in the third embodiment from the first embodiment will be explained. Parts configured similar to the first embodiment are assigned the same reference notations and explanations thereof are omitted.

As shown in FIG. 16, the cover member 50B in the present embodiment comprises only a plate-shaped rigid board which has a high rigidity (at least a higher rigidity than the base film 40), but does not have a center opening. This cover member 50B is, for example, composed of quartz glass and is designed to be able to transmit ultraviolet rays (ultraviolet rays can pass through the cover member 50B).

In the present embodiment, the base member 50B is designed to be able to transmit ultraviolet rays, so it is possible to accurately irradiate ultraviolet rays to the ultraviolet cure adhesive.

Further, in the present embodiment, by applying an ultraviolet cure adhesive as the adhesive forming the bonded part 80, it is possible to shorten the curing time and to cure the adhesive more evenly so as to secure a sufficient air-tightness in comparison with a thermosetting adhesive etc.

Further, in the present embodiment, the base film 40 of the base member 20A is designed to be opaque to ultraviolet rays (ultraviolet rays cannot pass through the base film 40), so it is possible to utilize reflection of the UV rays on the base film 40 to further promote curing of the ultraviolet cure adhesive.

Note that, it is also possible for the base frame 30 and base film 40 of the base member 20A to be able to transmit ultraviolet rays and for the cover member 50B to be opaque to ultraviolet rays.

Further, in the example shown in FIG. 16, the cover member 50B is laid over the base member 20A so that the base film 40 and the cover member 50B directly contact each other, but the invention is not particularly limited to this. For example, when the die 90 is relatively thick, while not particularly shown, the cover member 50B may be laid over the base member 20A so that the base frame 30 and the cover member 50B directly contact each other.

Fourth Embodiment

Figure 17:
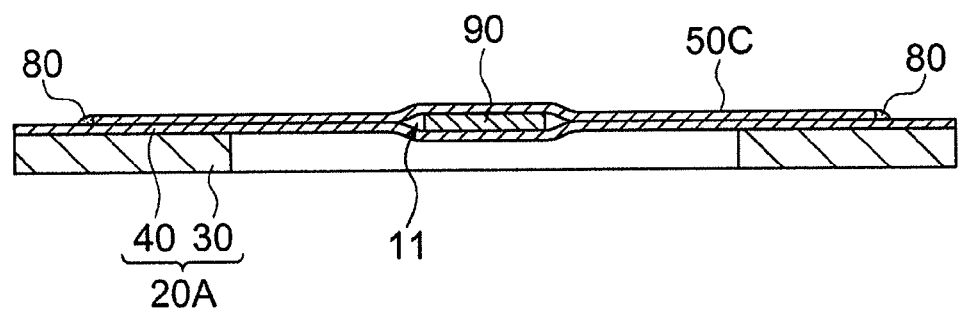
FIG. 17 is a cross-sectional view of a test carrier in a fourth embodiment of the present invention.

FIG. 17 is a view showing a test carrier in a fourth embodiment of the present invention.

In the present embodiment, the cover member differs in configuration from the first embodiment (see FIG. 3), but the rest of the configuration is similar to the first embodiment. Below, only the points of difference of the test carrier in the fourth embodiment from the first embodiment will be explained. Parts configured similar to the first embodiment are assigned the same reference notations and explanations thereof are omitted.

As shown in FIG. 17, the cover member 50C in the present embodiment comprises only a film having pliability. This cover member 50C is, for example, formed form a colorless transparent polyimide film or colorless transparent aramid film etc. and is designed to be able to transmit ultraviolet rays (ultraviolet rays can pass through the cover member 50C).

In the present embodiment, the cover member 50C is designed to transmit ultraviolet rays, so it is possible to accurately irradiate ultraviolet rays to the ultraviolet cure adhesive.

Further, in the present embodiment, by applying an ultraviolet rays as the adhesive forming the bonded part 80, it is possible to shorten the curing time and to cure the adhesive more evenly so as to secure a sufficient air-tightness in comparison with a thermosetting adhesive etc.

Further, in the present embodiment, the base film 40 of the base member 20A is designed to be opaque to ultraviolet rays (ultraviolet rays cannot pass through the base film 40), so it is possible to utilize reflection of the ultraviolet rays on the base film 40 to further promote curing of the ultraviolet cure adhesive.

Note that, it is also possible for the base frame 30 and base film 40 of the base member 20A to be able to transmit ultraviolet rays and for the cover member 50C to be opaque to ultraviolet rays.

Further, in the example shown in FIG. 17, the cover member 50C is laid over the base member 20A so that the base film 40 and the cover member 50C directly contact each other, but the invention is not particularly limited to this. For example, when the die 90 is relatively thick, while not particularly shown, the cover member 50C may be laid over the base member 20A so that the base frame 30 and the cover member 50C directly contact each other.

Fifth Embodiment

Figure 18:
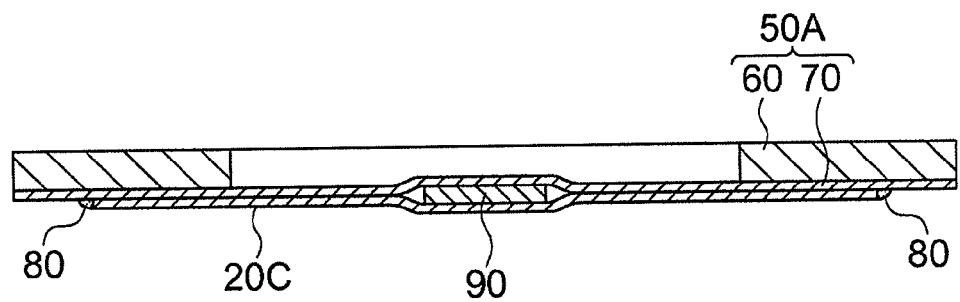
FIG. 18 is a cross-sectional view of a test carrier in a fifth embodiment of the present invention.

FIG. 18 is a view showing a test carrier in a fifth embodiment of the present invention.

In the present embodiment, the base member differs in configuration from the first embodiment (see FIG. 3), but the rest of the configuration is similar to the first embodiment. Below, only the points of difference of the test carrier in the fifth embodiment from the first embodiment will be explained. Parts configured similar to the first embodiment are assigned the same reference notations and explanations thereof are omitted.

As shown in FIG. 18, the base member 20C in the present embodiment comprises only a film which has pliability. This base member 20C is, for example, formed from a reddish brown or other colored polyimide film and is designed to be opaque to ultraviolet rays (ultraviolet rays cannot pass through the base member 20C).

In the present embodiment, the cover member 50A is designed to able to transmit ultraviolet rays (ultraviolet rays can pass through the cover member 50A), so it is possible to accurately irradiate ultraviolet rays to the ultraviolet cure adhesive.

Further, in the present embodiment, by applying an ultraviolet cure adhesive as the adhesive forming the bonded part 80, it is possible to shorten the curing time and to cure the adhesive more evenly so as to secure sufficient air-tightness in comparison with a thermosetting adhesive etc.

Further, in the present embodiment, the base member 20C is designed to be opaque to ultraviolet rays, so it is possible to utilize reflection of the ultraviolet rays on the base member 20C to further promote curing of the ultraviolet cure adhesive.

Note that, it is also possible for the base member 20C to be able to transmit ultraviolet rays and for the cover film 70 of the cover member 50A to be opaque to ultraviolet rays.

Further, in the example shown in FIG. 18, the cover member 50A is laid over the base member 20C so that the base member 20C and the cover film 70 directly contact each other, but the invention is not particularly limited to this. For example, when the die 90 is relatively thick, while not particularly shown, the cover member 50A may be laid over the base member 20C so that the base member 20C and the cover frame 60 directly contact each other.

Sixth Embodiment

Figure 19:
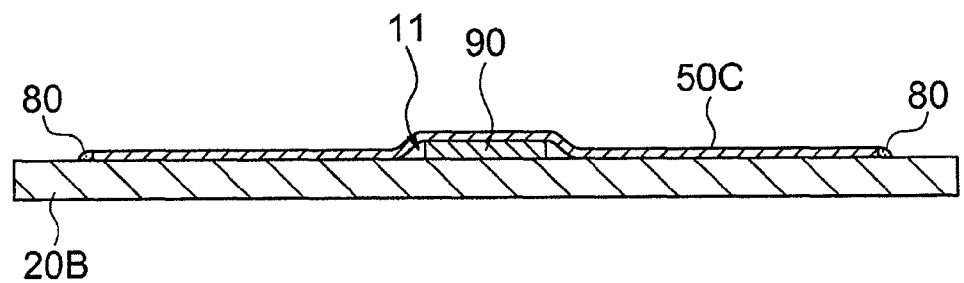
FIG. 19 is a cross-sectional view of a test carrier in a sixth embodiment of the present invention.

FIG. 19 is a view showing a test carrier in a sixth embodiment of the present invention.

In the present embodiment, the cover member differs in configuration from the second embodiment (see FIG. 15), but the rest of the configuration is similar to the second embodiment. Below, only the points of difference of the test carrier in the sixth embodiment from the second embodiment will be explained. Parts configured similar to the second embodiment are assigned the same reference notations and explanations thereof are omitted.

As shown in FIG. 19, the cover member 50C in the present embodiment comprises only a film having pliability. This cover member 50C is, for example, formed from a colorless transparent polyimide film or colorless transparent aramid film etc. and is designed to be able to transmit ultraviolet rays (ultraviolet rays can pass through the cover member 50C).

In the present embodiment, the cover member 50C is designed to be able to transmit ultraviolet rays, so it is possible to accurately irradiate ultraviolet rays to the ultraviolet cure adhesive.

Further, in the present embodiment, by applying an ultraviolet cure adhesive as the adhesive forming the bonded part 80, it is possible to shorten the curing time and to cure the adhesive more evenly so as to secure a sufficient air-tightness in comparison with a thermosetting adhesive etc.

Further, in the present embodiment, the base member 20B is designed to opaque to ultraviolet rays (ultraviolet rays cannot pass through the base member 20B), so it is possible to utilize reflection of the ultraviolet rays on the base member 20B to further promote curing of the ultraviolet cure adhesive.

Note that, it is also possible for the base member 20B to be able to transmit ultraviolet rays and for the cover member 50C to be opaque to ultraviolet rays.

Seventh Embodiment

Figure 20:
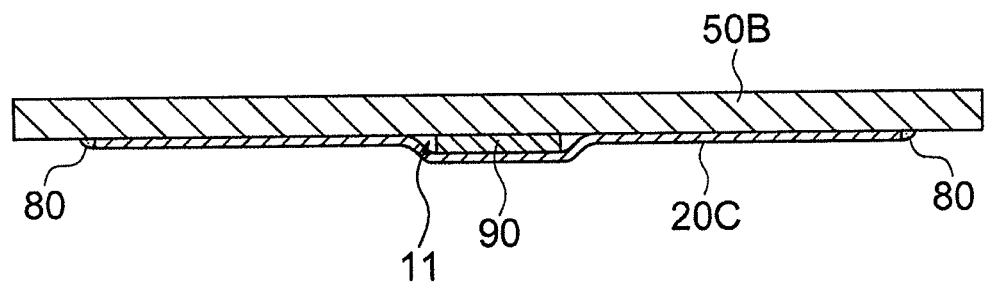
FIG. 20 is a cross-sectional view of a test carrier in a seventh embodiment of the present invention.

FIG. 20 is a view showing a test carrier in a seventh embodiment of the present invention.

In the present embodiment, the base member differs in configuration from the third embodiment (see FIG. 16), but the rest of the configuration is similar to the third embodiment. Below, only the points of difference of the test carrier in the seventh embodiment from the third embodiment will be explained. Parts configured similar to the third embodiment are assigned the same reference notations and explanations thereof are omitted.

As shown in FIG. 20, the base member 20C in the present embodiment comprises only a film which has pliability. This base member 20C is, for example, formed from a reddish brown or other colored polyimide film and is designed to be opaque to ultraviolet rays (ultraviolet rays cannot pass through the base member 20C).

In the present embodiment, the cover member 50B is designed to transmit ultraviolet rays (ultraviolet rays can pass through the cover member 50B), so it is possible to accurately irradiate ultraviolet rays to the ultraviolet cure adhesive.

Further, in the present embodiment, by applying an ultraviolet rays as the adhesive forming the bonded part 80, it is possible to shorten the curing time and to cure the adhesive more evenly so as to secure a sufficient air-tightness in comparison with a thermosetting adhesive etc.

Further, in the present embodiment, the base member 20C is designed to be opaque to ultraviolet rays, so it is possible to utilize reflection of the ultraviolet rays on the base member 20C to further promote curing of the ultraviolet cure adhesive.

Note that, it is also possible for the base member 20C to be designed to transmit ultraviolet rays and for the cover film 70 of the cover member 50B to be designed to be opaque to ultraviolet rays.

Eighth Embodiment

Figure 21:
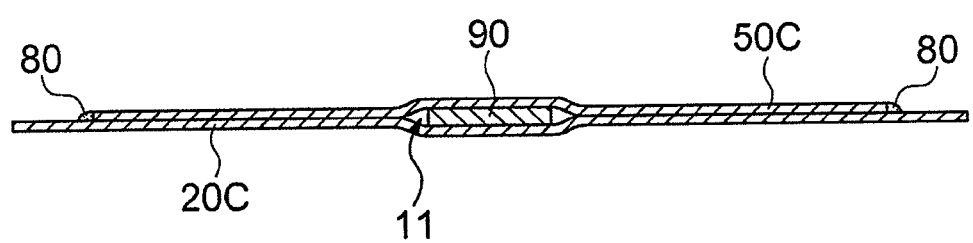
FIG. 21 is a cross-sectional view of a test carrier in an eighth embodiment of the present invention.

FIG. 21 is a view showing a test carrier in an eight embodiment of the present invention.

In the present embodiment, the base member differs in configuration from the fourth embodiment (see FIG. 17), but the rest of the configuration is similar to the fourth embodiment. Below, only the points of difference of the test carrier in the eighth embodiment from the fourth embodiment will be explained. Parts configured similarly to the fourth embodiment are assigned the same reference notations and explanations are omitted.

As shown in FIG. 21, the base member 20C in the present embodiment comprises only a film which has pliability. This base member 20C is, for example, formed from of a reddish brown or other colored polyimide film and is designed to be opaque to ultraviolet rays (ultraviolet rays cannot pass through the base member 20C).

In the present embodiment, the cover member 50C is designed to be able to transmit ultraviolet rays (ultraviolet rays can pass through the cover member 50C), so it is possible to accurately irradiate ultraviolet rays to the ultraviolet cure adhesive.

Further, in the present embodiment, by applying an ultraviolet cure adhesive as the adhesive forming the bonded part 80, it is possible to shorten the curing time and to cure the adhesive more evenly so as to secure a sufficient air-tightness in comparison with a thermosetting adhesive etc.

Further, in the present embodiment, the base member 20C is designed to opaque to ultraviolet rays, so it is possible to utilize reflection of the ultraviolet rays on the base member 20C to further promote curing of the ultraviolet cure adhesive.

Note that, it is also possible for the base member 20C to be able to transmit ultraviolet rays and for the cover member 50C to be opaque to ultraviolet rays.

Each of the cover members 50A to 50C in the first to eighth embodiments explained above correspond to one example of one of the first member or second member in the present invention, while each of the base members 20A to 20C in the first to eighth embodiment correspond to one example of the other of the second or first member in the present invention.

Note that the embodiments explained above were described for facilitating understanding of the present invention and were not described for limiting the present invention. Therefore, the elements disclosed in the above embodiments include all design modifications and equivalents falling under the technical scope of the present invention.

For example, in the second to eighth embodiments shown in FIG. 15 to FIG. 21, conduction paths such as shown in FIG. 9 to FIG. 13 may also be applied.

REFERENCE SIGNS LIST

10 . . . test carrier
11 . . . holding space
20A to 20C . . . base member
21 . . . bonding surface
22 . . . exposed region
30 . . . base frame
31 . . . center opening
40 . . . base film
41 . . . interconnect patterns
42 . . . base layer
43 . . . cover layer
431, 432 . . . through holes
44 . . . pad
45 . . . external terminal
46 . . . conduction path
50A to 50C . . . cover member
60 . . . cover frame
61 . . . center opening
70 . . . cover film
80 . . . bonded part
81 . . . adhesive
90 . . . die
91 . . . electrode

The invention claimed is:

1. A test carrier comprising a first member and a second member which are bonded to each other with an electronic device therebetween, wherein
    the first member has:
    a first film through which ultraviolet rays can pass; and
    a first frame which has a first opening formed at a center of the first frame, the first frame through which ultraviolet rays can pass, and the first frame to which the first film adheres,
    the second member has:
    a second film; and
    a second frame which has a second opening formed at a center of the second frame and to which the second film adheres,
    the electronic device is interposed between the first film and the second film,
    the first film and the second film are between the first frame and the second frame,
    the first film and the second film are adhered to each other by an ultraviolet cure adhesive, and
    the first film and the second film are directly in contact with the electronic device.

2. The test carrier as set forth in claim 1, wherein the second film is opaque to ultraviolet rays.

3. The test carrier as set forth in claim 1, wherein one of the first opening or the second opening is smaller than the other of the second opening or the first opening.

4. The test carrier as set forth in claim 1, wherein the electronic device is a die is which formed by dicing a semiconductor wafer.

5. The test carrier as set forth in claim 1, wherein a holding space which is formed between the first member and the second member and which holds the electronic device is reduced in pressure compared with an outside air.

6. The test carrier as set forth in claim 1, wherein, one of the second member or the first member is larger than the other of the first member or the second member, and one of the second member or the first member has an exposed part at a bonding surface with the other of the first member or the second member.

\* \* \* \* \*